US011211331B2

(12) United States Patent
Lin et al.

(10) Patent No.: US 11,211,331 B2
(45) Date of Patent: Dec. 28, 2021

(54) SEMICONDUCTOR STRUCTURE HAVING A VIA AND METHODS OF MANUFACTURING THE SAME

(71) Applicant: Vanguard International Semiconductor Corporation, Hsinchu (TW)

(72) Inventors: Yung-Fong Lin, Taoyuan (TW); Li-Wen Chuang, Taoyuan (TW); Jui-Hung Yu, Tainan (TW); Cheng-Tao Chou, Huwei Township (TW); Chun-Hsu Chen, Sinpu Township (TW); Yu-Chieh Chou, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 51 days.

(21) Appl. No.: 16/749,335

(22) Filed: Jan. 22, 2020

(65) Prior Publication Data

US 2021/0225770 A1 Jul. 22, 2021

(51) Int. Cl.
| | |
|---|---|
| *H01L 23/535* | (2006.01) |
| *H01L 21/74* | (2006.01) |
| *H01L 21/308* | (2006.01) |
| *H01L 21/311* | (2006.01) |
| *H01L 21/768* | (2006.01) |

(52) U.S. Cl.
CPC ........ *H01L 23/535* (2013.01); *H01L 21/3081* (2013.01); *H01L 21/31144* (2013.01); *H01L 21/743* (2013.01); *H01L 21/76804* (2013.01)

(58) Field of Classification Search
CPC ............. H01L 23/535; H01L 21/31144; H01L 21/3081; H01L 21/743; H01L 21/76804
See application file for complete search history.

(56) References Cited

U.S. PATENT DOCUMENTS

| | | | |
|---|---|---|---|
| 2015/0097265 A1* | 4/2015 | Lin ................... | H01L 21/76224 257/526 |
| 2020/0013706 A1* | 1/2020 | Kang ................... | H01L 21/486 |

FOREIGN PATENT DOCUMENTS

TW        I619241 B        3/2018

OTHER PUBLICATIONS

Taiwanese Office Action and Search Report for Taiwanese Application No. 108134505, dated May 6, 2021.

* cited by examiner

*Primary Examiner* — Quoc D Hoang
(74) *Attorney, Agent, or Firm* — Birch, Stewart, Kolasch & Birch, LLP

(57) ABSTRACT

A semiconductor structure and a method for manufacturing the same are provided. The semiconductor structure includes a substrate and a seed layer on the substrate. The substrate includes a base and a composite layer encapsulating the base. The semiconductor structure also includes an epitaxial layer on the seed layer. The semiconductor structure also includes a semiconductor device on the epitaxial layer, and an interlayer dielectric layer on the epitaxial layer. The interlayer dielectric layer covers the semiconductor device. The semiconductor structure further includes a via structure that penetrates at least the composite layer of the substrate and is in contact with the base.

19 Claims, 16 Drawing Sheets

SEMICONDUCTOR STRUCTURE HAVING A VIA AND METHODS OF MANUFACTURING THE SAME

BACKGROUND

Technical Field

The disclosure relates to a semiconductor structure and methods of manufacturing the same, and it relates to a semiconductor structure with a via structure and methods of manufacturing the same.

Description of the Related Art

In recent years, the development of semiconductor structures for use in computers, consumer electronics and other fields has progressed rapidly. Currently, semiconductor structure technology has been widely accepted in Metal-Oxide-Semiconductor Field-Effect Transistor (MOSFET) products that have a high market share. Semiconductor structures are used in a variety of electronic applications, such as high-power devices, personal computers, cell phones, digital cameras, and other electronic devices. These semiconductor structures are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these semiconductor structures, high-electron mobility transistors (HEMTs) have been widely used in the field of high-power applications since they have such advantages as high output power and high breakdown voltage. Although existing semiconductor structures and methods for manufacturing the same have been adequate for their intended purposes, they have not been entirely satisfactory in all respects. Therefore, there are still some problems to be overcome in regards to semiconductor integrated circuits and technology.

SUMMARY

Some embodiments of the present disclosure provide semiconductor structures. A semiconductor structure includes a substrate and a seed layer disposed on the substrate. The substrate includes a base and a composite layer encapsulating the base. The semiconductor structure also includes an epitaxial layer disposed on the seed layer. The semiconductor structure also includes a semiconductor device disposed on the epitaxial layer, and an interlayer dielectric layer disposed on the epitaxial layer and covering the semiconductor device. The semiconductor structure further includes a via structure that penetrates at least the composite layer and is in contact with the base of the substrate.

Some embodiments of the present disclosure methods of manufacturing semiconductor structures. A method includes providing a substrate, wherein the substrate includes a base and a composite layer encapsulating the base. The method includes forming a seed layer on the substrate, and forming an epitaxial layer on the seed layer. The method also includes forming a semiconductor device on the epitaxial layer, and forming an interlayer dielectric layer on the epitaxial layer. The interlayer dielectric layer covers the semiconductor device. The method further includes forming a via structure that penetrates at least the composite layer, wherein the via structure is in contact with the base of the substrate.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
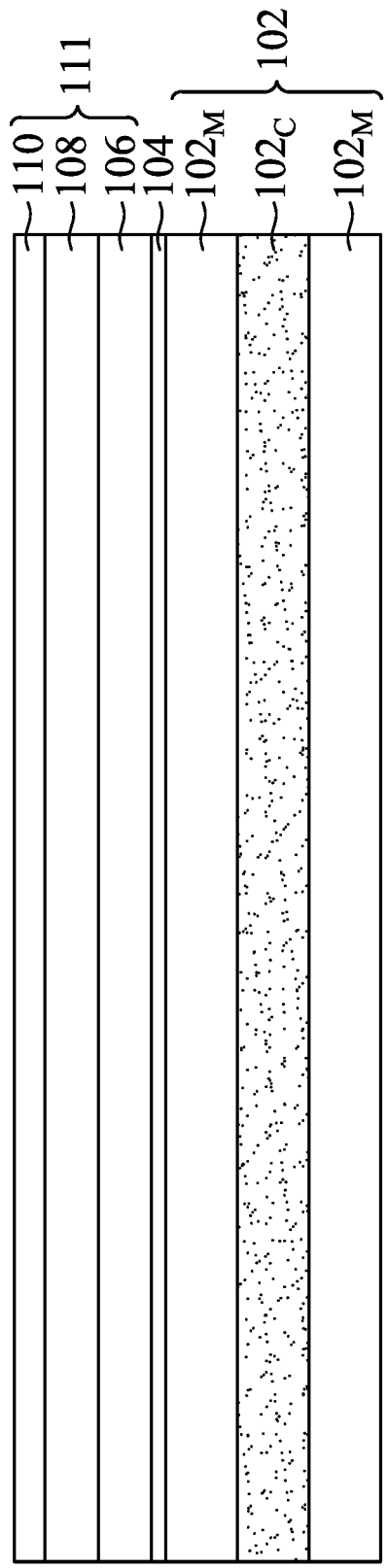
FIG. 1A-FIG. 1K illustrate cross-sectional views of intermediate stages of a method of manufacturing a semiconductor structure in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor structures and methods of manufacturing the same. An exemplary embodiment of a semiconductor structure includes a via structure that penetrates at least the composite layer of the substrate and is in contact with the base of the substrate. In some embodiments, the via structure includes an insulating material that isolates the active region, or it isolates one or more of the semiconductor devices in the active region. In some other embodiments, the via structure includes a conductive material, such as a metal material or polysilicon, that functions as a ground or provides heat dissipation for the active region or for one or more semiconductor devices in the active region, thereby improving the electrical performances of the semiconductor structure. Also, according to the manufacturing methods of the embodiments, the via structure with a small size and a sufficient depth, that is, a via structure with a high aspect ratio of depth to width, can be obtained. Accordingly, the via structure of the embodiment can be formed with very little or no impact on the original area of the semiconductor structure. Also, the electrical performance of the semiconductor structure can be significantly improved. In some of the embodiments described below, a high electron mobility transistor (HEMT) is used to illustrate a semiconductor structure. However, the present disclosure is not limited thereto. Some embodiments of the present disclosure can be applied to other types of semiconductor structures.

FIG. 1A-FIG. 1K illustrate cross-sectional views of intermediate stages of a method of manufacturing a semiconductor structure in accordance with some embodiments of the present disclosure. As shown in FIG. 1A, a substrate 102 is provided. In some embodiments, the substrate 102 includes a base $102_C$ and a composite layer $102_M$ encapsulating the base $102_C$. For example, the composite layer $102_M$ covers all of the surfaces (the top surface, the bottom surfaces and all of the side surfaces) of the base $102_C$. In some embodiments, the base $102_C$ of the substrate 102 includes a ceramic material. The ceramic material may include a metal inorganic material. In some embodiments, the base 10 includes silicon carbide (SiC), aluminum nitride, sapphire, or another suitable material. The aforementioned sapphire base may comprise aluminum oxide. In some embodiments, the composite layer $102_M$ encapsulating the base $102_C$ includes a single insulating material layer, several insulating material layers, or another suitable material layer (such as a semiconductor layer). The insulating layer may include an oxide, a nitride, an oxynitride, or another suitable material. The semiconductor layer of the composite layer $102_M$ may be a polysilicon layer. To simplify the drawings, a single insulating layer in FIG. 1A-FIG. 1K is exemplified as the composite layer $102_M$ for illustrating a process for forming a via structure according to some embodiments of the present disclosure.

Next, a seed layer 104 is formed on the substrate 102, and an epitaxial layer 111 is formed on the seed layer 104, as shown in FIG. 1A.

In some embodiments, the seed layer 104 is made of silicon (Si) or another applicable material. In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly pasting seed crystals, or another applicable process. The CVD process may include a vapor-phase epitaxy (VPE) process, a low pressure CVD (LPCVD) process, an ultra-high vacuum CVD (UHV-CVD) process, or another applicable process.

In some embodiments, the epitaxial layer 111 of the HEMT structure includes a buffer layer 106, a channel layer 108 and a barrier layer 110.

In some embodiments, a buffer layer 106 is formed on the seed layer 104 using an epitaxial growth process. Formation of the buffer layer 106 may be helpful to mitigate the strain on a channel layer 108 that is subsequently formed on the buffer layer 106, and to prevent defects from forming in the overlying channel layer 108. In some embodiments, the buffer layer 106 includes AlN, GaN, $Al_xGa_{1-x}N$ (wherein 0<x<1), a combination of thereof, or the like. The buffer layer 106 may be formed using a process such as hydride vapor phase epitaxy (HVPE), molecular beam epitaxy (MBE), metal organic chemical vapor deposition (MOCVD), a combination thereof, or the like. Although the buffer layer 106 in the embodiment shown in FIG. 1A is a single layer, the buffer layer 106 may be a multilayered structure in other embodiments.

Next, a channel layer 108 is formed on the buffer layer 106 by epitaxial growth. In some embodiments, the channel layer 108 includes an undoped III-V group compound semiconductor material. For example, the channel layer 108 is made of undoped GaN, but the present disclosure is not limited thereto. In some other embodiments, the channel layer 108 includes AlGaN, AlN, GaAs, GaInP, AlGaAs, InP, InAlAs, InGaAs, other applicable III-V group compound materials, or a combination thereof. In some embodiments, the channel layer 108 is formed using a molecular-beam epitaxy method (MBE), a hydride vapor phase epitaxy method (HVPE), a metalorganic chemical vapor deposition method (MOCVD), other applicable methods, or a combination thereof.

Next, a barrier layer 110 is formed on the channel layer 108 by epitaxial growth. In some embodiments, the barrier layer 110 includes an undoped III-V group compound semiconductor material. For example, the barrier layer 110 includes undoped $Al_xGa_{1-x}N$ (wherein 0<x<1), but the present disclosure is not limited thereto. In some other embodiments, the barrier layer 110 includes GaN, AlN, GaAs, GaInP, AlGaAs, InP, InAlAs, InGaAs, other applicable III-V group compound materials, or a combination thereof. The barrier layer 110 may be formed using a molecular-beam epitaxy method (MBE), a metalorganic chemical vapor deposition method (MOCVD), a hydride vapor phase epitaxy method (HVPE), other applicable methods, or a combination thereof.

In some embodiments, the channel layer 108 and the barrier layer 110 include different materials from each other such that a heterojunction is formed between the channel layer 108 and the barrier layer 110. Therefore, a two-dimensional electron gas (2DEG) which is generated by the band gap between the hetero-materials may be formed at the interface between the channel layer 108 and the barrier layer 110. In some embodiments, the semiconductor structures, such as high electron mobility transistors (HEMT), may utilize 2DEG as conductive carriers.

Also, in some embodiments, the epitaxial layer 111 is a GaN-containing composite layer. However, the present disclosure is not limited thereto. Besides the buffer layer 106, the channel layer 108 and the barrier layer 110, the epitaxial layer 111 may further include other films and/or layers. In some other embodiments, a carbon-doped layer is further formed between the buffer layer 106 and the channel layer 108 to increase the breakdown voltage of the semiconductor structure.

Figure 1B:
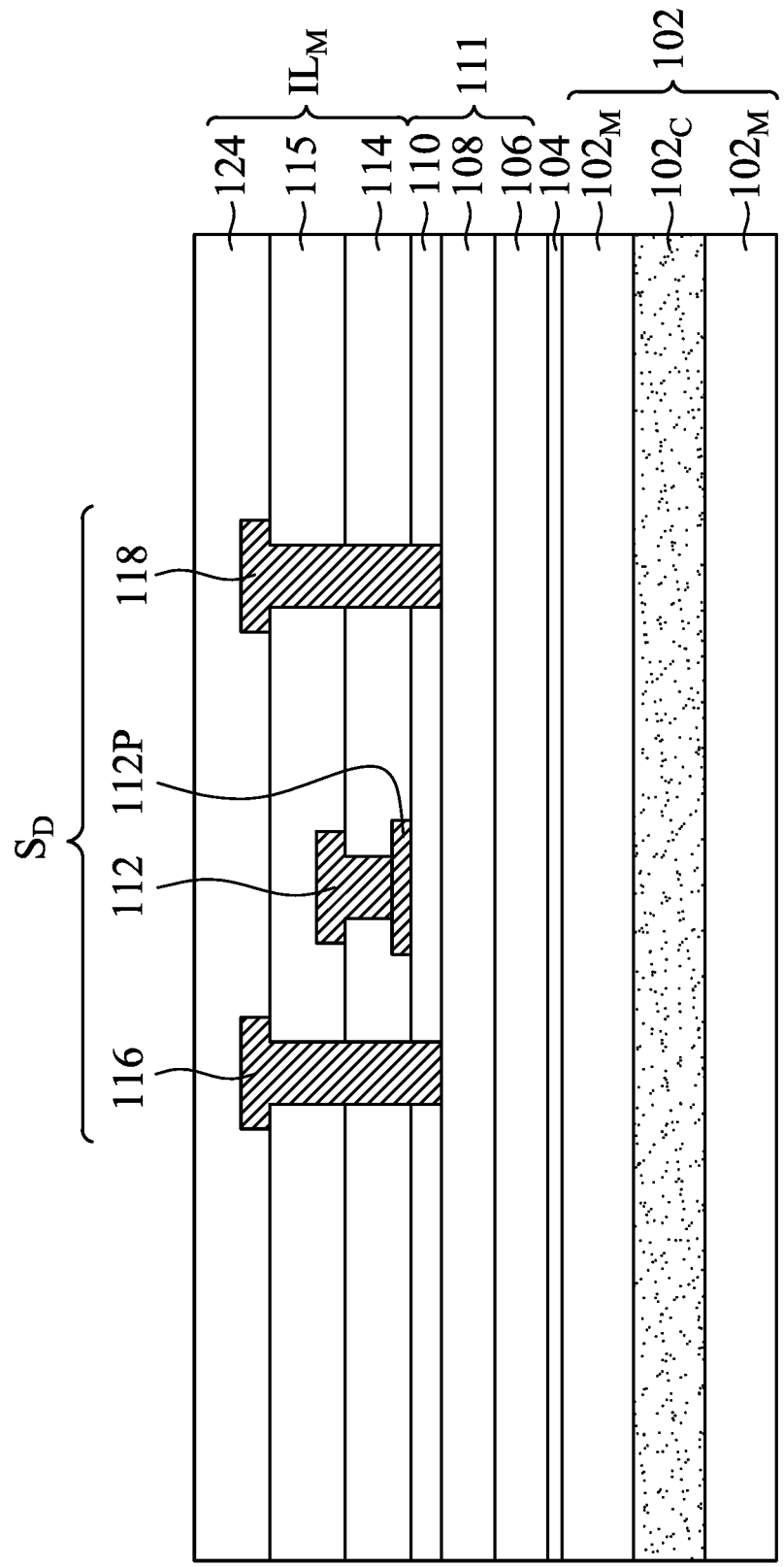

Referring to FIG. 1B, a semiconductor device $S_D$ and an interlayer dielectric layer $IL_M$ are formed on the epitaxial layer 11 in accordance with some embodiments of the present disclosure. Also, the interlayer dielectric layer $IL_M$ covers the semiconductor device $S_D$.

In some embodiments, the semiconductor device $S_D$ includes a gate electrode, the source electrode 116 and the drain electrode 118 formed at opposite sides of the gate electrode. In FIG. 1B an enhanced mode (i.e. normally-off) high-electron mobility transistor (HEMT) is exemplified as the semiconductor device $S_D$ in accordance with some embodiments of the present disclosure. That is, a doped III-V group semiconductor layer 112P is further formed below the gate electrode 112.

As shown in FIG. 1B, the doped III-V group semiconductor layer 112P is formed on the barrier layer 110. In some embodiments, the doped III-V group semiconductor layer 112P includes suitable dopants. For example, the doped III-V group semiconductor layer 112P is made of a p-type GaN material. In some other embodiments, the doped III-V group semiconductor layer 112P includes p-type doped AlGaN, GaN, AlN, GaAs, GaInP, AlGaAs, InP, InAlAs, InGaAs, other applicable III-V group compound materials, or a combination thereof. In addition, the doped III-V group semiconductor layer 112P may be formed by atomic layer deposition (ALD), chemical vapor deposition (CVD), physical vapor deposition (PVD), an epitaxial process, ion implantation, or an in-situ doping process.

As shown in FIG. 1B, in some embodiments, a first insulating layer 114 is formed on the epitaxial layer and conformably covers the doped III-V group semiconductor layer 112P. In some embodiments, the first insulating layer 114 includes silicon oxide, silicon nitride, silicon oxynitride, a combination thereof, or the like. Also, the first insulating layer 114 is formed by chemical vapor deposition (CVD), physical vapor deposition (PVD), atomic layer deposition (ALD), high density plasma chemical vapor deposition (HDPCVD), or a combination of thereof.

As shown in FIG. 1B, a gate electrode 112 is then formed on the first insulating layer 114, and the doped III-V group semiconductor layer 112P is connected to the gate electrode 112. In some embodiments, the gate electrode 112 includes a metal material, metal silicide, polysilicon, other suitable conductive materials, or a combination thereof. The gate metal layer 112 and the doped III-V group semiconductor layer 112P may have Schottky contact formed therebetween. In some embodiments, the gate electrode 112 is formed by atomic layer deposition (ALD), chemical vapor deposition (CVD), physical vapor deposition (PVD)(such as sputtering), or the like.

In some embodiments, a second insulating layer 115 is formed on the first insulating layer 114, and the second insulating layer 115 conformably covers the gate electrode 112, as shown in FIG. 1B. The materials and processes used to form the second insulating layer 115 may be similar to, or the same as, those used to form the first insulating layer 114, and are not repeated herein.

Next, a source electrode 116 and a drain electrode 118 are formed at opposite sides of the gate electrode 112. As shown in FIG. 1B, the source electrode 116 and the drain electrode 118 are disposed on the channel layer 108 and electrically contact the channel layer 108, in accordance with some embodiments. In some embodiments, the source electrode 116 and the drain electrode 118 include a conductive material, such as Au, Ni, Pt, Pd, Ir, Ti, Cr, W, Al, Cu, TaN, TiN, $WSi_2$, or a combination thereof. In some embodiments, the source electrode 116 and the drain electrode 118 are formed by atomic layer deposition (ALD), chemical vapor deposition (CVD), physical vapor deposition (PVD)(such as sputtering), electron beam evaporation, or the like. In some embodiments, after a material layer of the source electrode 116 and the drain electrode 118 is deposited, a high-temperature thermal process such as an annealing process is performed to form source/drain ohmic contacts.

Next, in some embodiments, a third insulating layer 124 is formed on the second insulating layer 115, and the third insulating layer 124 conformably covers the source electrode 116 and the drain electrode 118, as shown in FIG. 1B. The materials and processes used to form the third insulating layer 124 may be similar to, or the same as, those used to form the first insulating layer 114, and are not repeated herein. Also, the first insulating layer 114, the second insulating layer 115 and the third insulating layer 124 form an interlayer dielectric layer $IL_M$, wherein the covers the semiconductor device $S_D$.

Afterwards, a via structure is formed, and the via structure penetrates at least the composite layer $102_M$ and is in contact with the base $102_C$ of the substrate 102. According to the descriptions below, the opening of the via structure is required to penetrate several stacked material layers, such as the interlayer dielectric layer $IL_M$, the epitaxial layer 111, the seed layer 104 and the composite layer $102_M$, to expose the surface of the base $102_C$. In some embodiments, several mask layers are used for forming the opening of the via structure.

Figure 1C:
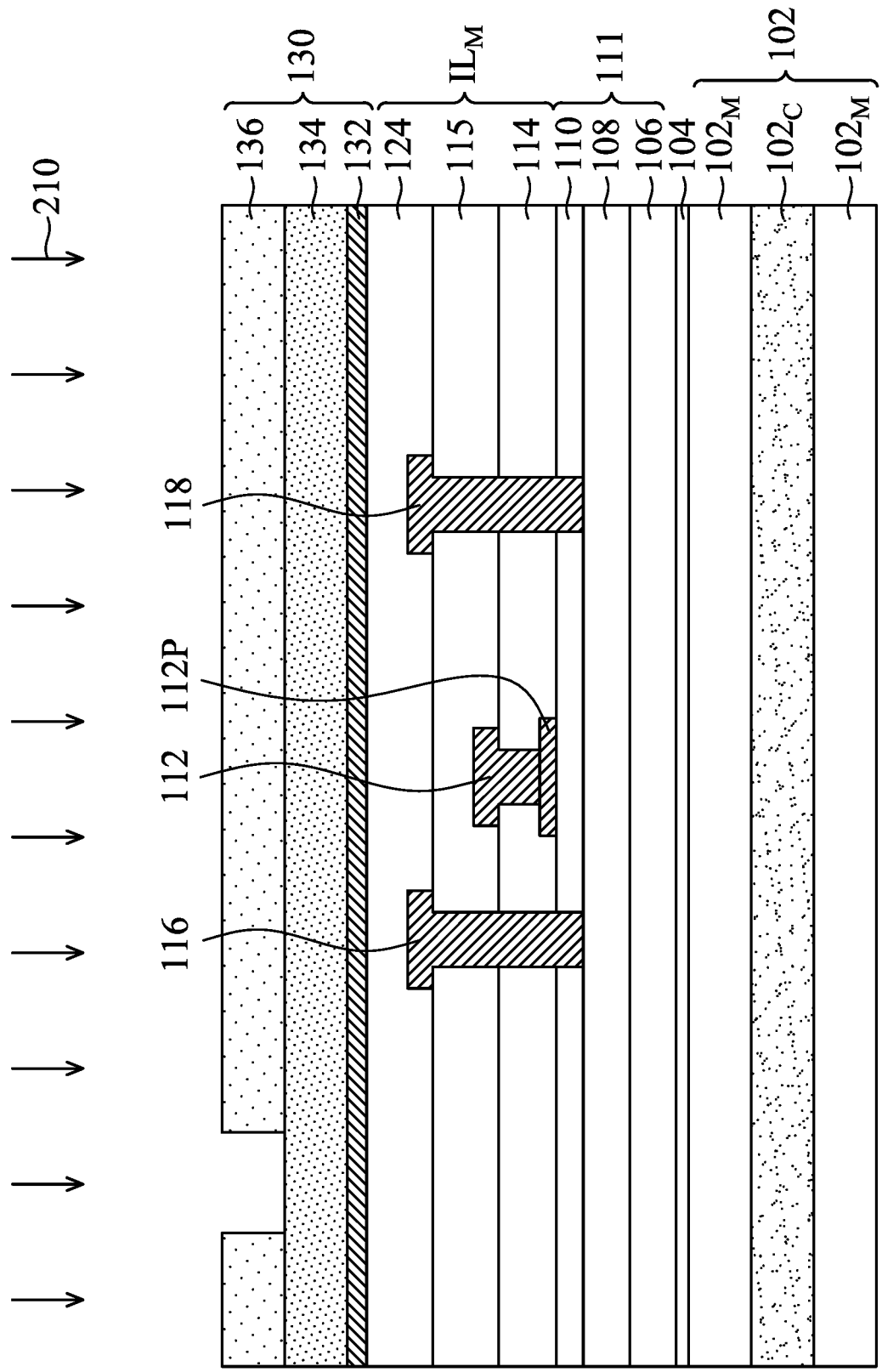

FIG. 1C-FIG. 1G illustrate a method for forming an opening of a via structure using several mask layers in accordance with some embodiments of the present disclosure. Referring to FIG. 1C, in some embodiments, a multi-layer mask 130 is formed on the interlayer dielectric layer $IL_M$. For example, the multilayer mask 130 includes a first ma s k layer 132 formed on the interlayer dielectric layer $IL_M$, a second mask layer 134 formed on the first mask layer 132, and a patterned third mask 136 layer on the second mask layer 134.

In some embodiments, the first mask layer 132, the second mask layer 134 and the patterned third mask layer 136 of the multilayer mask 130 include different materials. In some embodiments, the patterned third mask layer 136 is a patterned photoresist layer.

In some embodiments, the second mask layer 134 may include an oxide, a nitride, an oxynitride, or another suitable material. Also, the second mask layer 134 can be formed using chemical vapor deposition (such as high density plasma chemical vapor deposition (HDPCVD)), a spin coating process, atomic layer deposition (ALD), or a combination of thereof. In some embodiments, the second mask layer 134 is less porous than the interlayer dielectric layer $IL_M$.

In some embodiments, the first mask layer 132 disposed between the second mask layer 134 and the interlayer dielectric layer $IL_M$ includes a material different from the materials for forming the second mask layer 134 and the interlayer dielectric layer $IL_M$. Also, an etchant gas used in subsequent etching processes has different selectivity to the material of the first mask layer 132 and the material of the second mask layer 134. For example, an etchant gas for rapidly etching and removing the second mask layer 134 does not etch or etches the first mask layer 132 very slowly. In some embodiments, the first mask layer 132 functions as an etch stop layer while the second mask layer 134 is removed. In some embodiments, the first mask layer 132 includes a metal compound, such as a metal nitride.

Figure 1D:
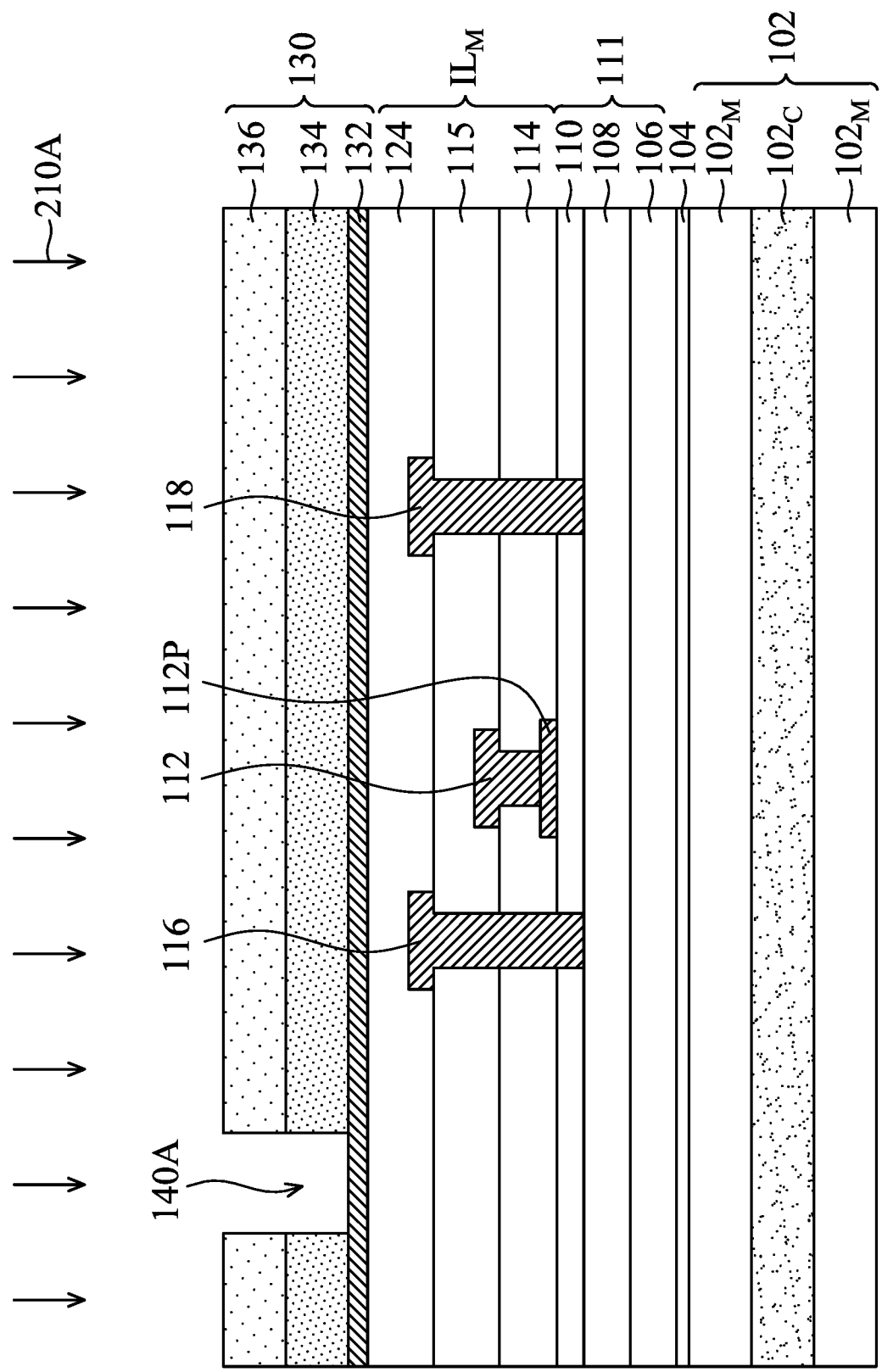
Figure 1E:
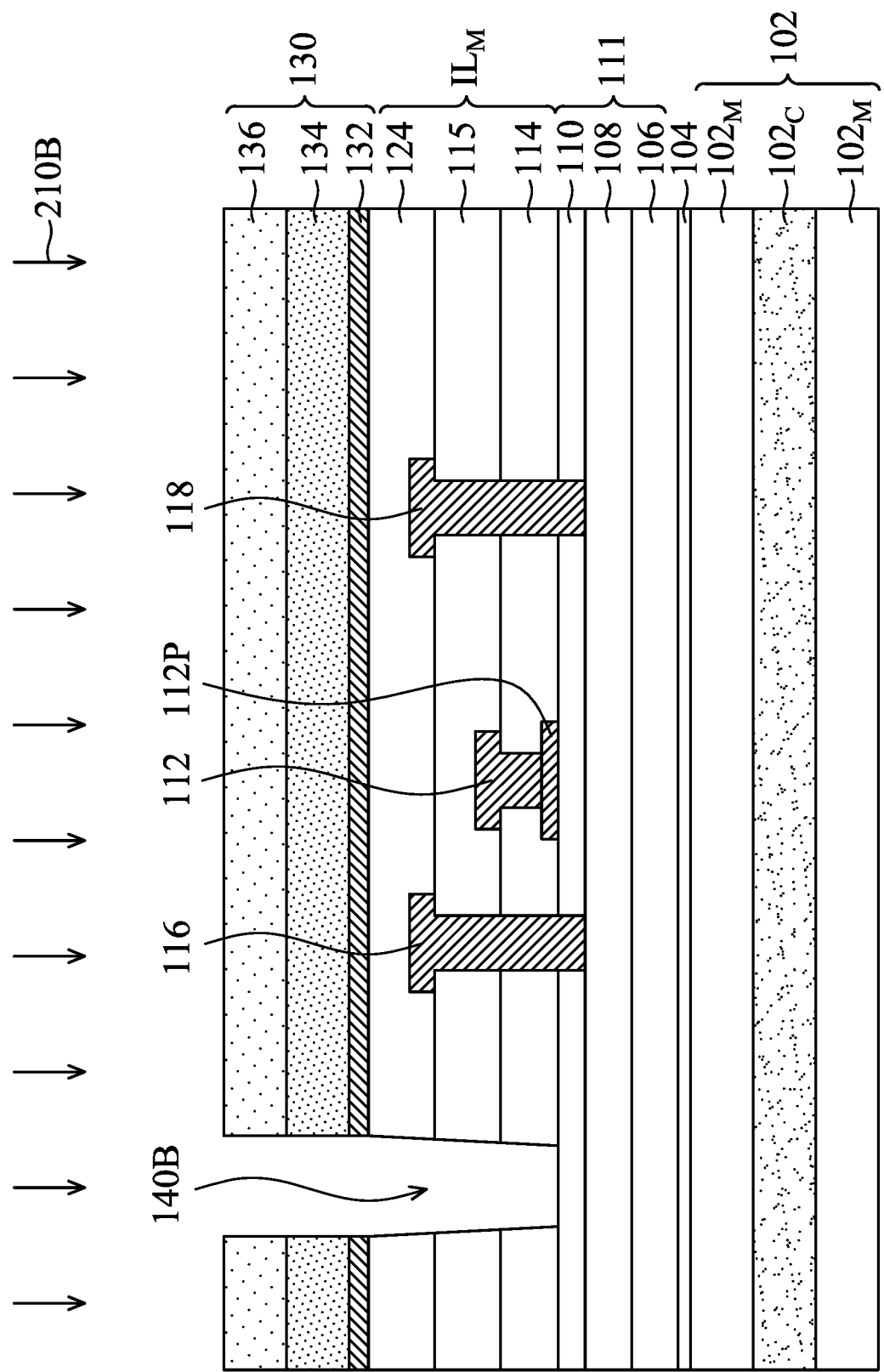

In some embodiments, an etching process 210 is performed using the patterned third mask layer 136 to etch the material layers underneath, such as etching the second mask layer 134, the first mask layer 132 and the interlayer dielectric layer $IL_M$, thereby forming an opening to expose the epitaxial layer 111. FIG. 1D and FIG. 1E illustrate steps of forming the opening exposing the epitaxial layer 111 in accordance with some embodiments.

In some embodiments, an etching process including two etching steps is implemented for forming the opening exposing the epitaxial layer 111. As shown in FIG. 1D and FIG. 1E, a first etching step 210A and a second etching step 210B are implemented. Also, the first etching step 210A and the second etching step 210B are performed in-situ in the same etching chamber.

Referring to FIG. 1D, in some embodiments, the first etching step 210A is performed to etch the second mask layer 134 using a first etchant gas, thereby forming an opening 140A. As shown in FIG. 1D, the opening 140A exposes a part of the surface of the first mask layer 132.

In some embodiments, after the first etching step 210A is complete, the substrate and the layers formed thereon are not moved out of the etching chamber and the second etching step 210B is continuously performed in the etching chamber without interruption. In some embodiments, the second etching step 210B and the first etching step 210A use different etchant gases.

Referring to FIG. 1E, in some embodiments, the second etching step 210B is performed to etch the first mask layer 132 and the interlayer dielectric layer $IL_M$ along the opening 140A using a second etchant gas, thereby forming an opening 140B. As shown in FIG. 1E, the opening 140B exposes the epitaxial layer 111, such as exposing a part of the surface of the barrier layer 110 of the epitaxial layer 111. According to some embodiments, the first etchant gas and the second etchant gas have different fluorocarbon ratios. In some embodiments, the fluorocarbon ratio of the first etchant gas is smaller than the fluorocarbon ratio of the second etchant gas. For example, the first etchant gas is $C_4F_8$, and the second etchant gas is $CF_4$.

Figure 1F:
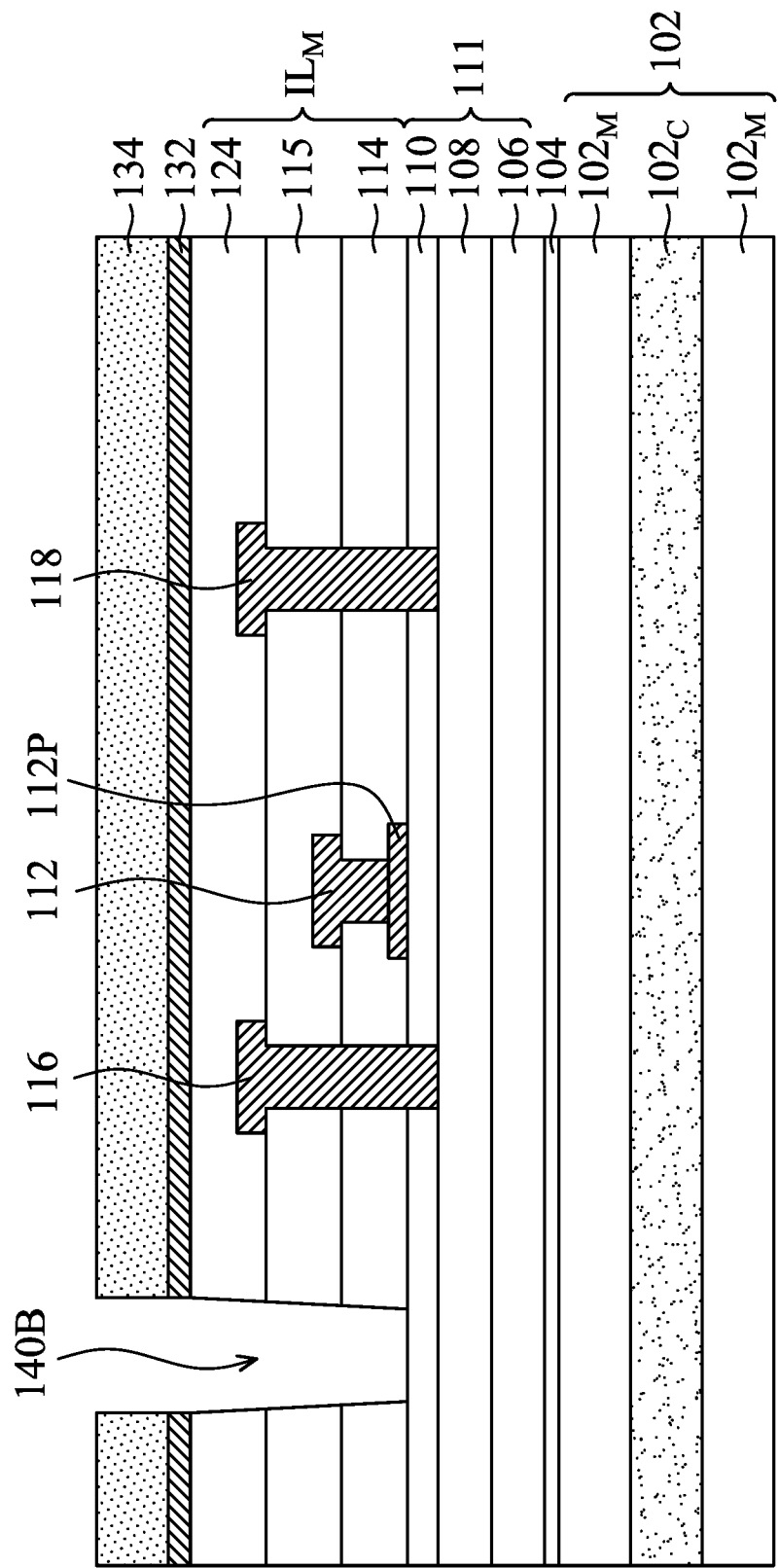

After forming the opening 140B, an ashing process may be performed to remove the patterned third mask layer 136 on the second mask layer 134, as shown in FIG. 1F.

Figure 1G:
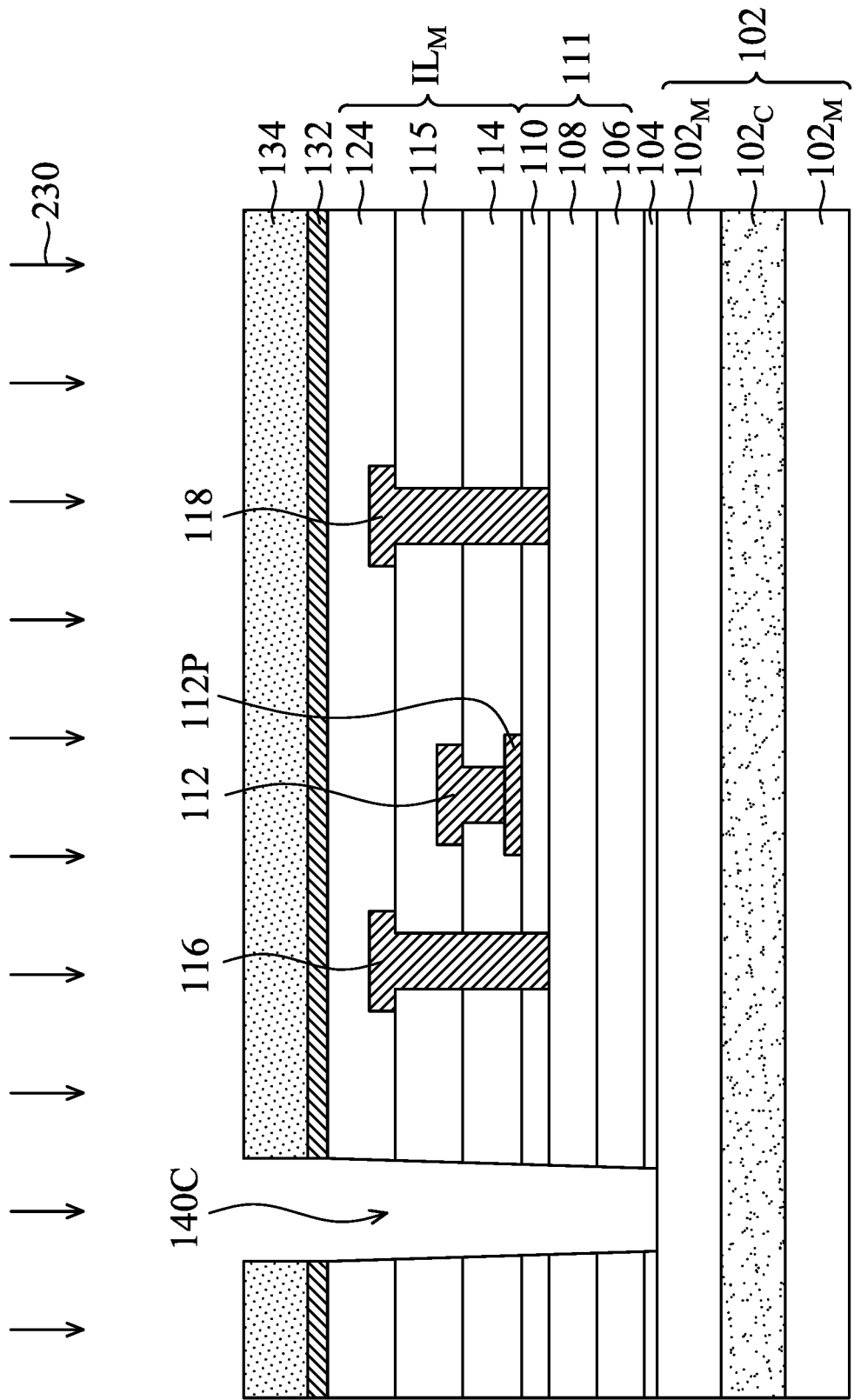

Next, as shown in FIG. 1G, after the patterned third mask layer 136 is removed, the epitaxial layer 111 and the seed layer 104 are etched along the opening 140B using the second mask layer 134 as an etch mask, thereby forming the opening 140C. The opening 140C exposes the substrate 102, such as exposing the surface of the composite layer $102_M$ of the substrate 102.

Figure 2A:
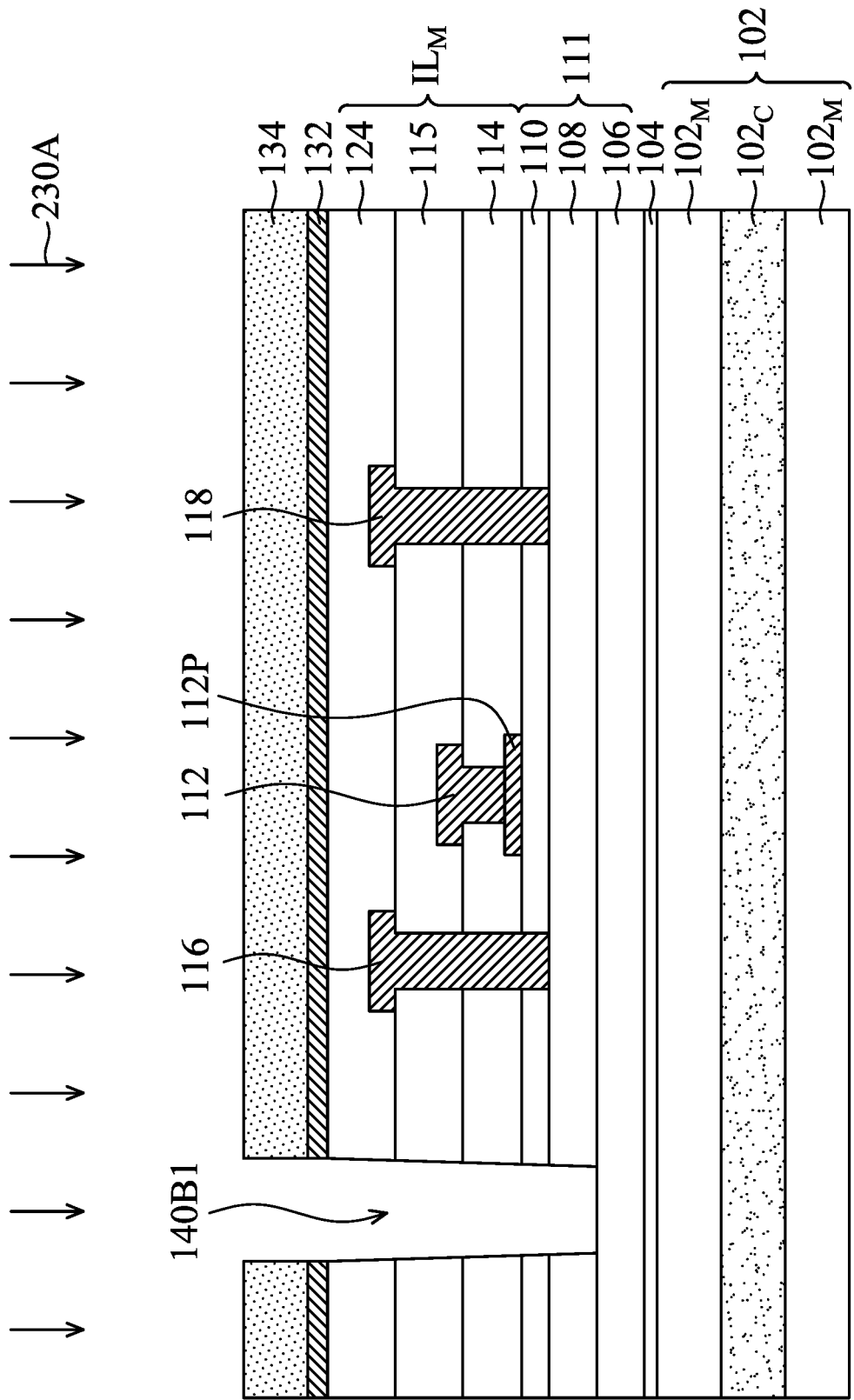
FIG. 2A-FIG. 2C illustrate one of implementable methods for forming the opening in FIG. 1G, in accordance with some embodiments of the present disclosure.
Figure 2B:
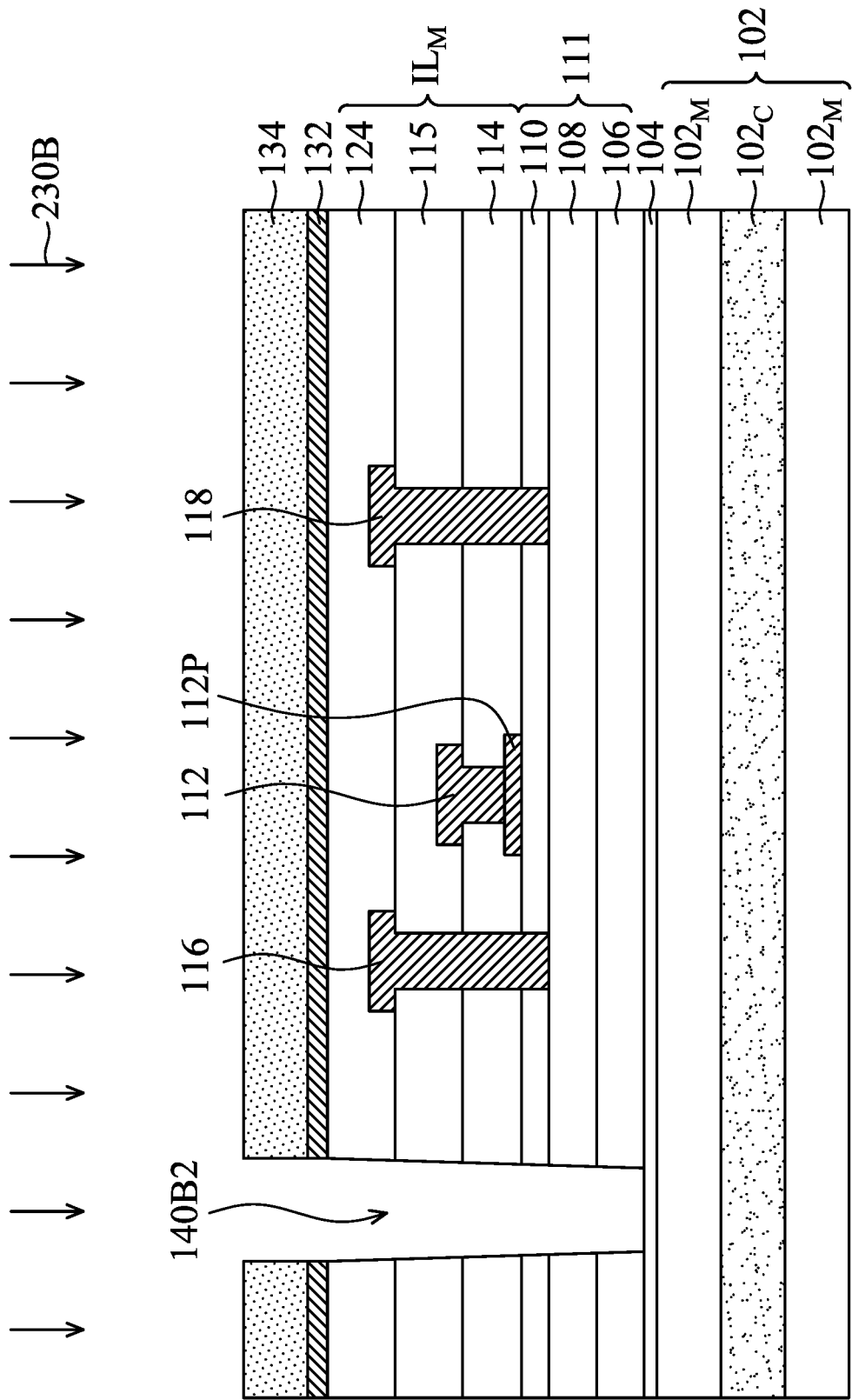
Figure 2C:
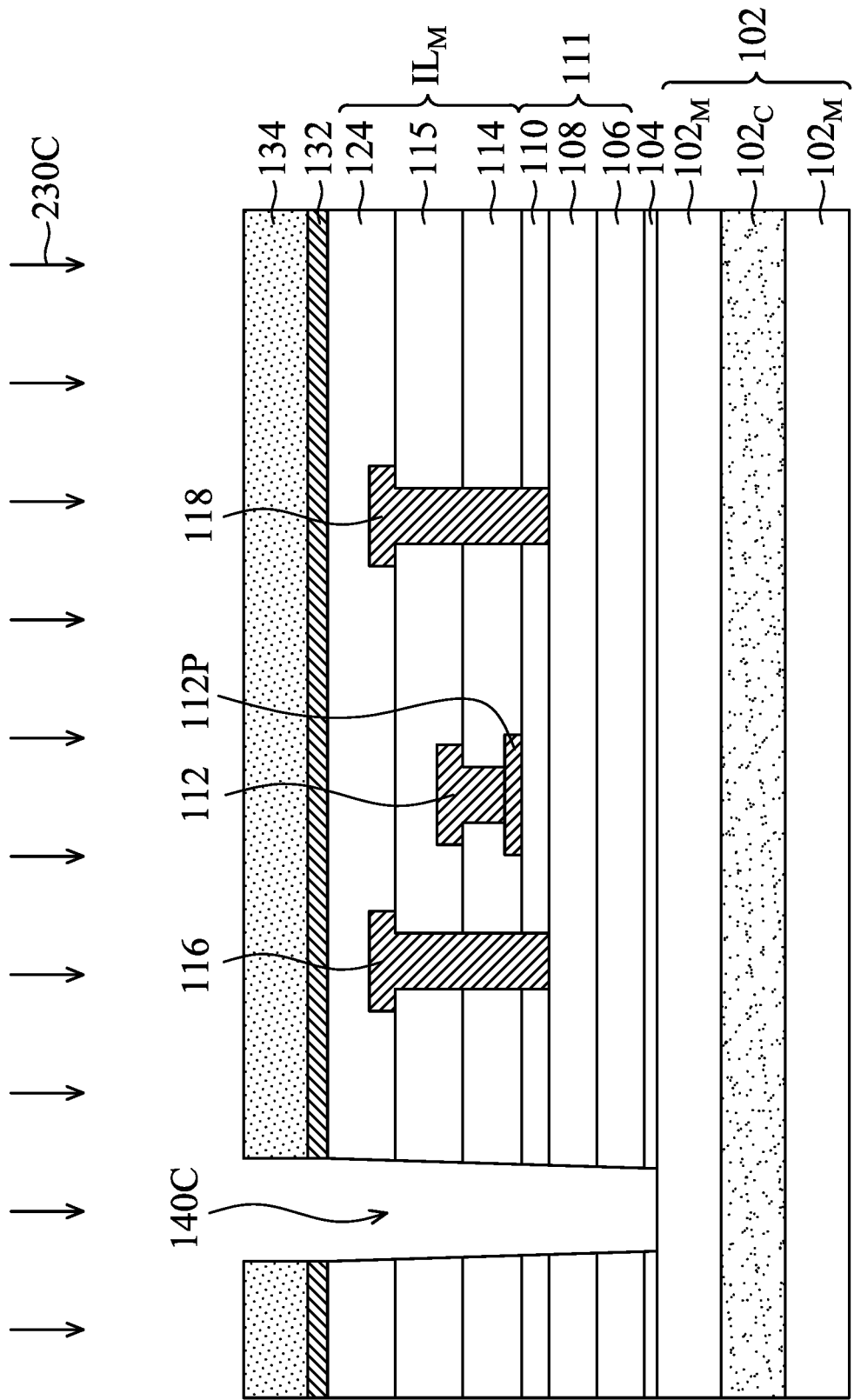

According to some embodiments, the process for passing through the epitaxial layer 111 and the seed layer 104 to form the opening 140C includes several etching steps. FIG. 2A-FIG. 2C illustrate one of implementable methods for forming the opening 140C in FIG. 1G, in accordance with some embodiments of the present disclosure.

Referring to FIG. 1F and FIG. 2A, in some embodiments, the epitaxial layer 111 is etched along the opening 140B in FIG. 1F, using an adequate etchant gas and the second mask layer 134 as an etch mask. Also, in some embodiments, a cleaning step is performed after the etching step is completed.

According to some embodiments, the epitaxial layer 111 is etched along the opening 140B (FIG. 1F) using the first and second etching steps 230A. Thus, the barrier layer 110 and the channel layer 108 are etched to form the opening 140B1, and shown in FIG. 2A.

Next, the buffer layer 106 is etched along the opening 140B1 using the third etching step 230B to form the opening 140B2, and shown in FIG. 2B.

Afterwards, the seed layer 104 is etched along the opening 140B2 using the fourth etching step 230C to form the opening 140C, and shown in FIG. 2C. It should be noted that the structure depicted in FIG. 2C is identical to the structure depicted in FIG. 1G.

During the etching steps, large amounts of reaction products are generated by the etchant gas and the material layers to be etched. In order to prevent excessive reaction products from blocking the opening during the etching steps, which may terminate the etching process or lead to a poor profile of the opening, a cleaning step may be performed to remove unwanted reaction products after each of the etching steps is completed.

In some embodiments, the epitaxial layer 111 is a GaN-containing composite layer. $Cl_2$, $BCl_3$, Ar or other suitable etchant gas can be used to etch the GaN-containing composite layer, and several etching steps are implemented. For example, three or more etching steps can be implemented to etch the epitaxial layer 111 having a thickness of about 5 μm. However, the number of etching steps is not limited herein. In practical applications, the number of etching steps for etching the epitaxial layer 111 may be determined by the materials, the number of layers included in the epitaxial layer 111, and the etching conditions (such as the type and flow rate of the etchant gas, plasma source and bias power). Additionally, in some embodiments, unwanted residuals can be removed by high power plasma and argon as plasma gas after each of the etching steps is completed.

According to the processes described above, the opening 140C exposing the substrate 102 has been formed as shown in FIG. 1G. Then, a process for extending the opening 140C is performed, thereby penetrating the composite layer $102_M$ and exposing the base $102_C$.

Figure 1H:
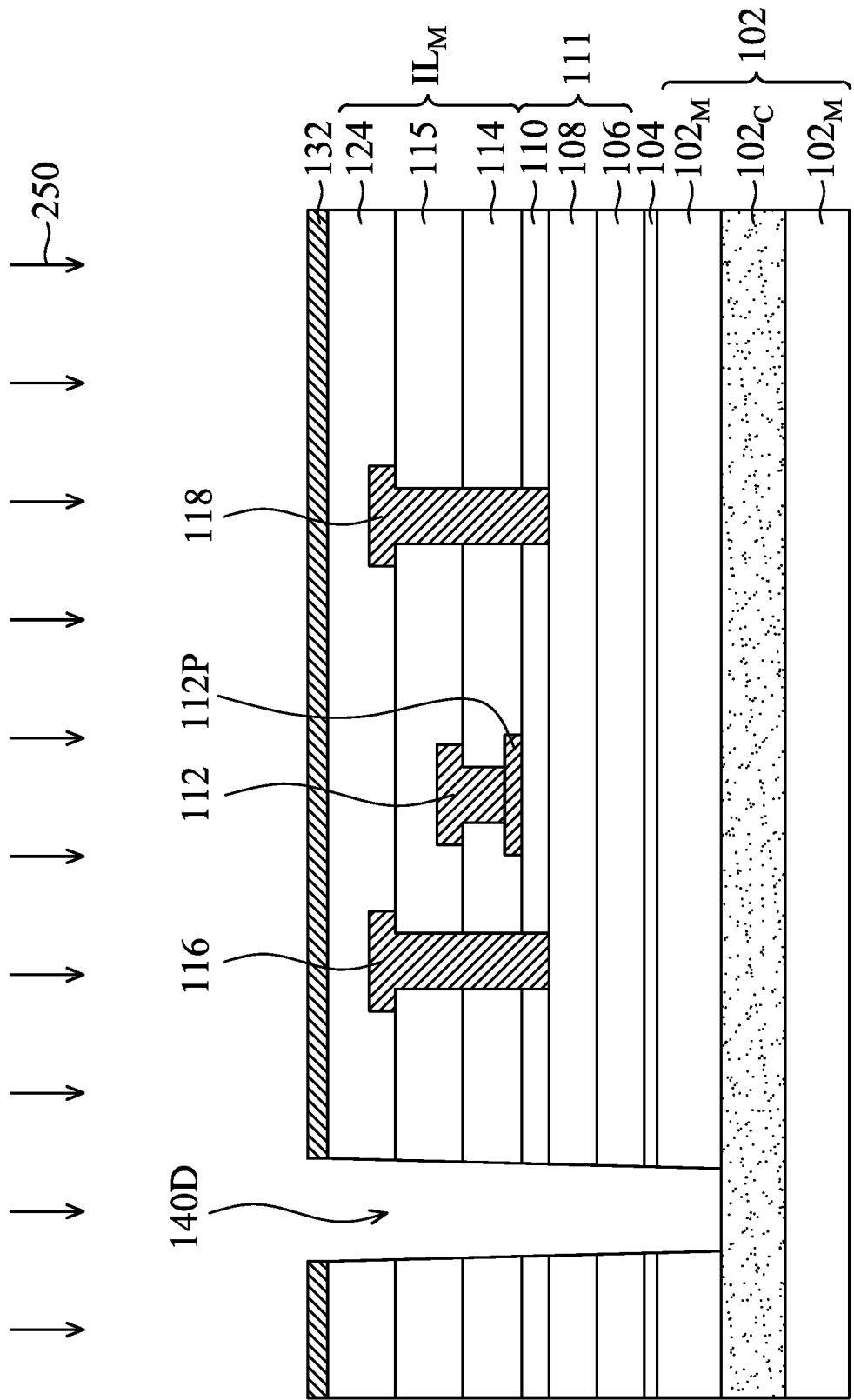

Referring to FIG. 1H, in some embodiments, an etching process 250 is performed to remove the second mask layer 134 after forming the opening 140C. It should be noted that this etching process 250 also etches through the composite layer $102_M$ along the opening 140C, thereby forming an opening 140D exposing the base $102_C$. In some embodiments, the second mask layer 134 is removed by dry etching.

In some embodiments, the etchant gas for removing the second mask layer 134 does not etch the first mask layer 132. Therefore, after the second mask layer 134 is completely removed, the first mask layer 132 is still remained on the interlayer dielectric layer $IL_M$. In one example, an etchant gas having a fluorocarbon ratio (F-to-C ratio) of less than 4 (such as $C_4F_8$) can be used for dry etching the second mask layer 134.

Figure 1I:
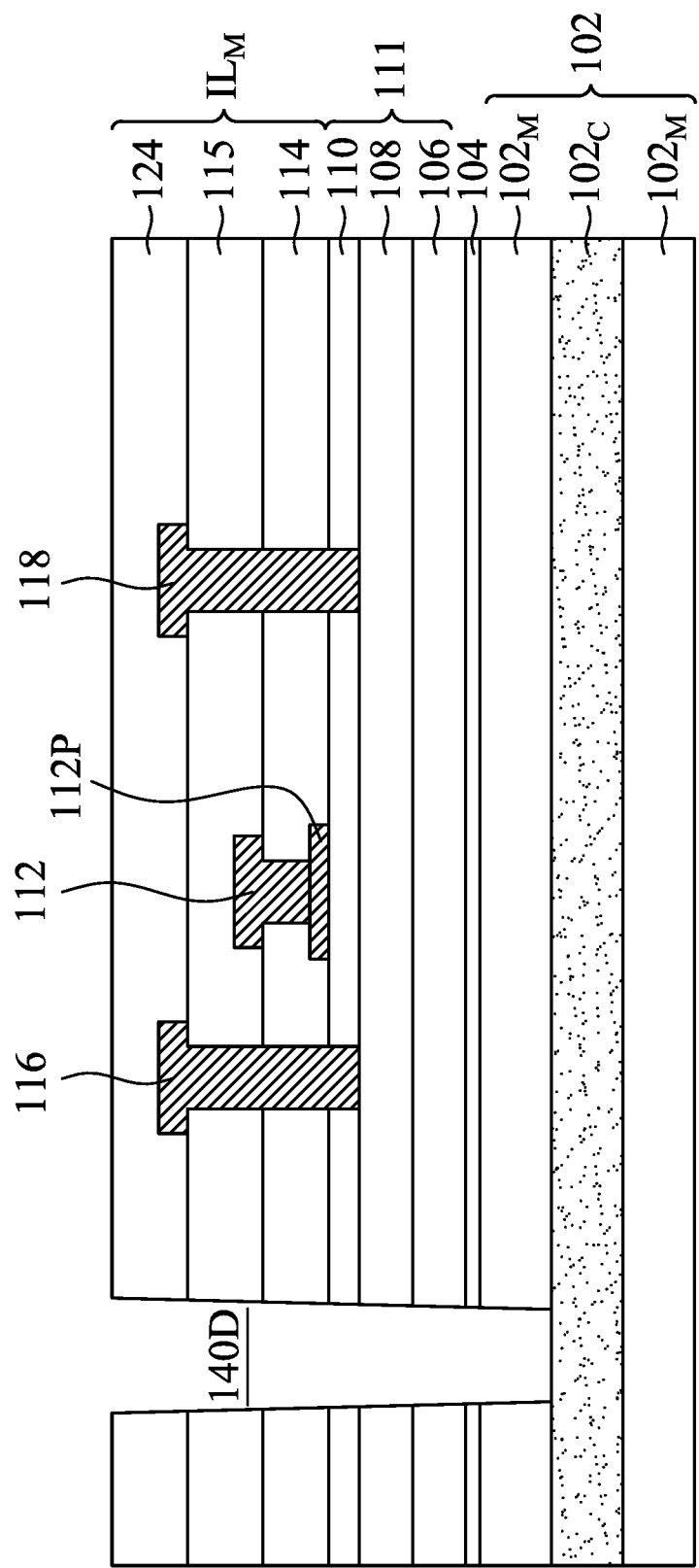

Next, referring to FIG. 1I, after the second mask layer 134 is removed, removal of the first mask layer 132 on the interlayer dielectric layer $IL_M$ is performed. In some embodiments, the first mask layer 132 is removed by wet etching.

According to the processes of some embodiments as described above, the opening 140D with a high aspect ratio (width to depth ratio) can be formed using the multilayer mask 130. As shown in FIG. 1I, the opening 140D penetrates the interlayer dielectric layer $IL_M$, the epitaxial layer 111 and the composite layer $102_M$ of the substrate 102, thereby exposing the base $102_C$.

Figure 1J:
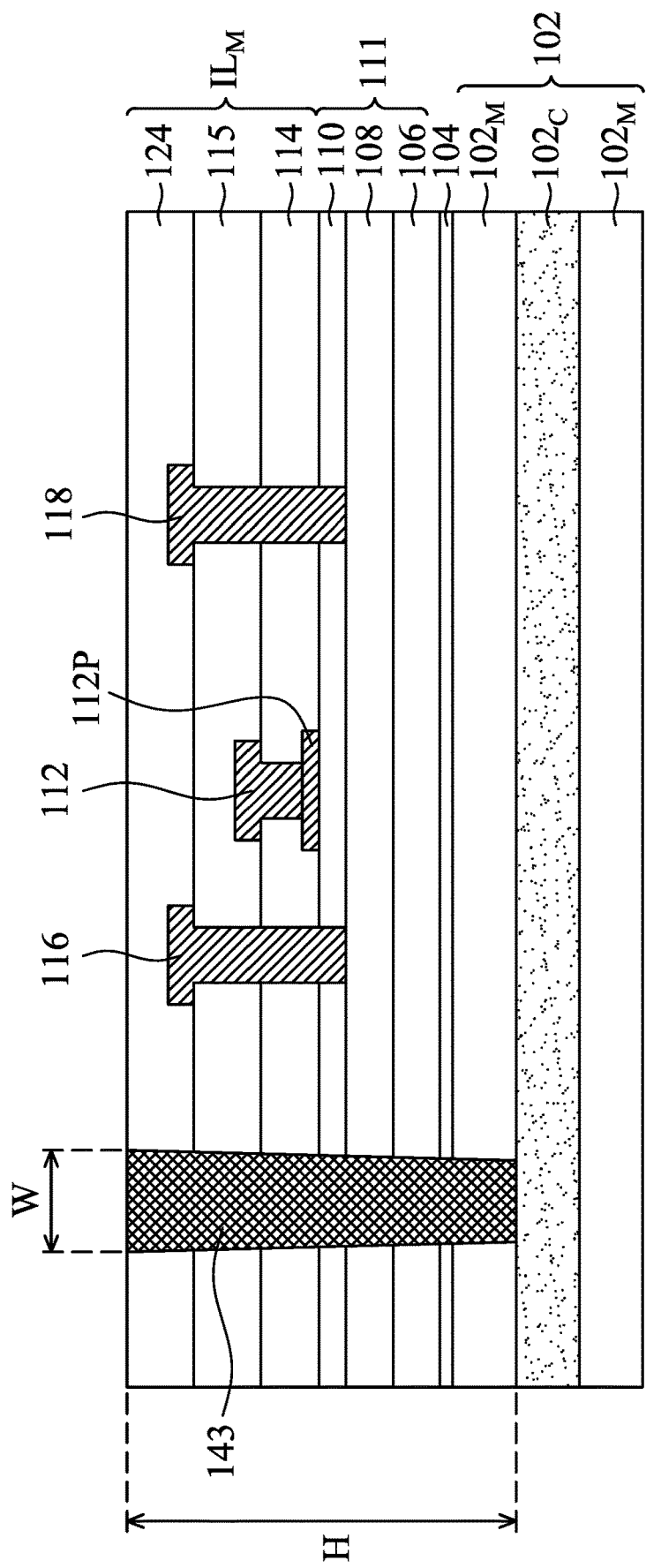

Afterwards, as shown in FIG. 1J, the opening 140D is filled with a suitable material to form a via structure 143. The via structure 143 penetrates at least the composite layer $102_M$ of the substrate 102 and is in contact with the base $102_C$. Materials for filling the opening 140D can be selected based on the requirements of practical application. For example, in some embodiments, the via structure 143, formed by filling the opening 140D with a conductive material (such as conductor or semiconductor material), functions as a ground or provides heat dissipation. In some embodiments, the via structure 143 includes a conductive material, such as Au, Ni, Pt, Pd, Ir, Ti, Cr, W, Al, Cu, TaN, TiN, WSi$_2$, or a combination thereof. In some embodiments, the via structure 143 includes polysilicon. In some other embodiments, the via structure 143 further includes a barrier layer or an adhesion layer (not shown) deposited at the sidewalls of the opening 140D, followed by depositing the conductive material into the opening 140D to form the via structure 143.

In addition, the opening 140D is filled with one or more insulating materials to form a via structure 143 for the purpose of isolation, in accordance with some other embodiments. In some embodiments, the via structure 143 includes a nitride, an oxide, or another suitable material. In some embodiments, the via structure 143 with one or more insulating materials can be formed by atomic layer deposition (ALD), chemical vapor deposition (CVD), spin-on glass (SOG), flowable chemical vapor deposition (FCVD), high density plasma chemical vapor deposition (HDPCVD), or the like. In some other embodiments, the via structure 143 includes a liner on the sidewalls of the opening 140D.

According to the aforementioned processes of some embodiments, a via structure 143 with a small diameter but a sufficient depth H can be formed. The via structure 143 penetrates the interlayer dielectric layer IL$_M$, the epitaxial layer 111 and the composite layer 102$_M$ of the substrate 102, and contacts the base 102$_C$. Therefore, the via structure 143 of the embodiments occupies a very small area of the semiconductor structure, and may be formed without affecting the area of original semiconductor structure. In some embodiments, an area of the via structure 143 at the top surface of the interlayer dielectric layer IL$_M$ has a width W (in FIG. 1J) in a range of 1 μm to 5 μm. In some other embodiments, the width W of the via structure 143 is in a range of 1 μm to 3 μm. Additionally, in some embodiments, an aspect ratio (depth-to-width) of the via structure 143 is in a range of about 1.6 to about 8.

Figure 1K:
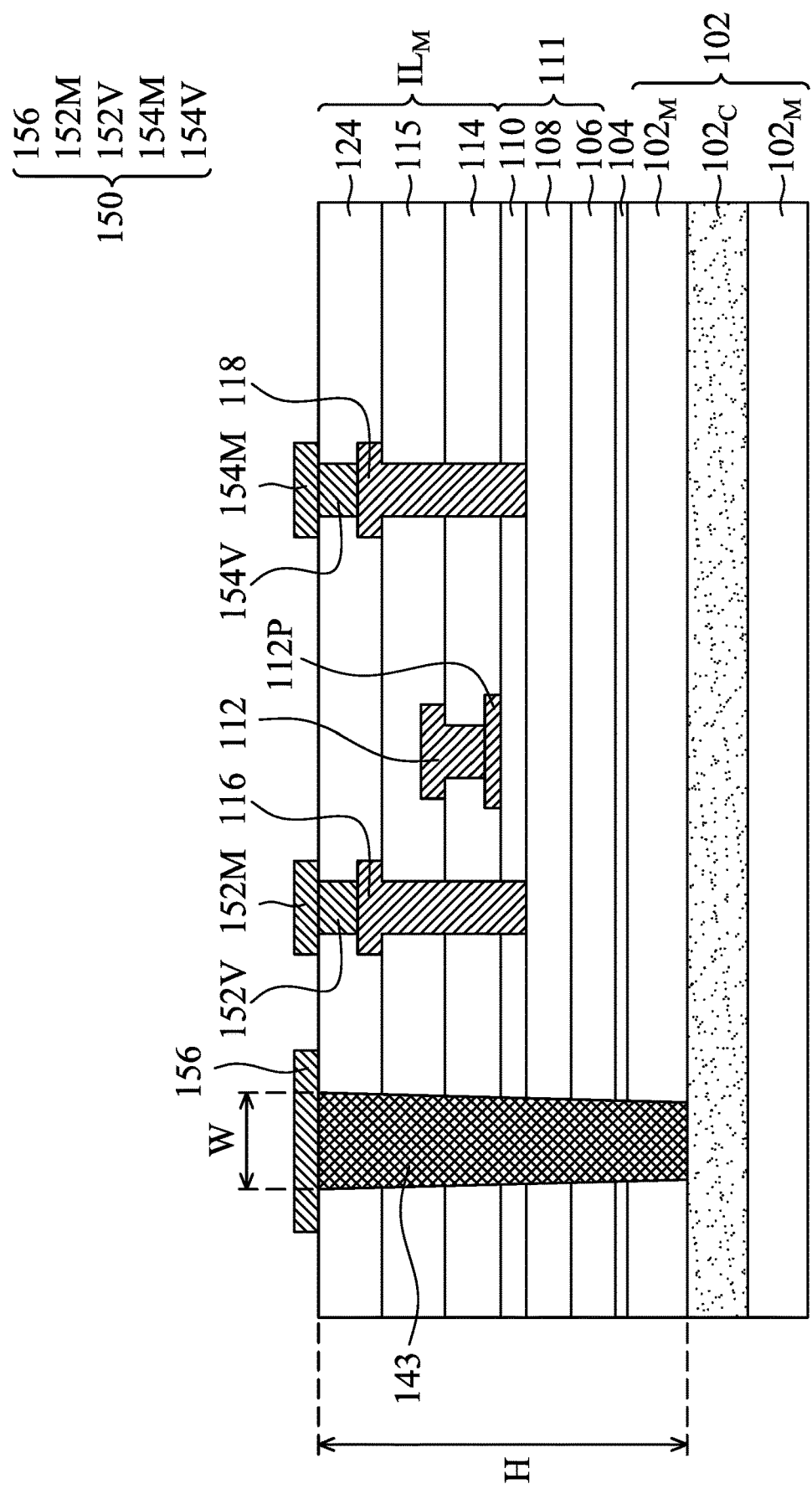

As shown in FIG. 1K, in some embodiments, related devices of the semiconductor structure (such as HEMT) to be formed on the source electrode 116, the drain electrode 118 and the via structure 143 can be fabricated after the via structure 143 is formed. For example, a metal layer 150 is formed on the source electrode 116, the drain electrode 118 and the via structure 143, followed by alternately forming other metal layers (not shown) and inter-metal dielectric layers (not shown) above the metal layer 150. In some embodiments, the via structure 143 directly contacts the metal layer 150 of the semiconductor structure.

In some embodiments, the third insulating layer 124 is patterned to form several holes (not shown) exposing the source electrode 116 and the drain electrode 118. A metal material layer is then deposited on the third insulating layer 124 and fills up the holes, followed by any acceptable patterning process. Thus, several conductive vias and metal portions can be formed. As shown in FIG. 1K, in some embodiments, the conductive via 152V and the metal portion 152M are formed above the source electrode 116, while the conductive via 154V and the metal portion 154M are formed above the drain electrode 118. Also, the metal portion 156 is formed on the via structure 143. The conductive vias 152V and 154V, the metal portion 152M, 154M and 156 form the metal layer 150.

In some embodiments, the metal layer 150 can be referred as the first metal layer (M1). Although FIG. 1K depicts the insulating layer 124 and the first metal layer for illustration, more insulating layers (not shown) and more metal layers (not shown) are alternately stacked on the first metal layer in subsequent processes. Also, several conductive vias are formed within inter-metal dielectric layers to electrically connect adjacent metal layers. In some embodiments, the via structure 143 including one or more conductive materials directly contacts the metal layer 150, and also electrically connects conductive vias and other metal layers above, thereby forming a ground path or a heat dissipation path.

Figure 3:
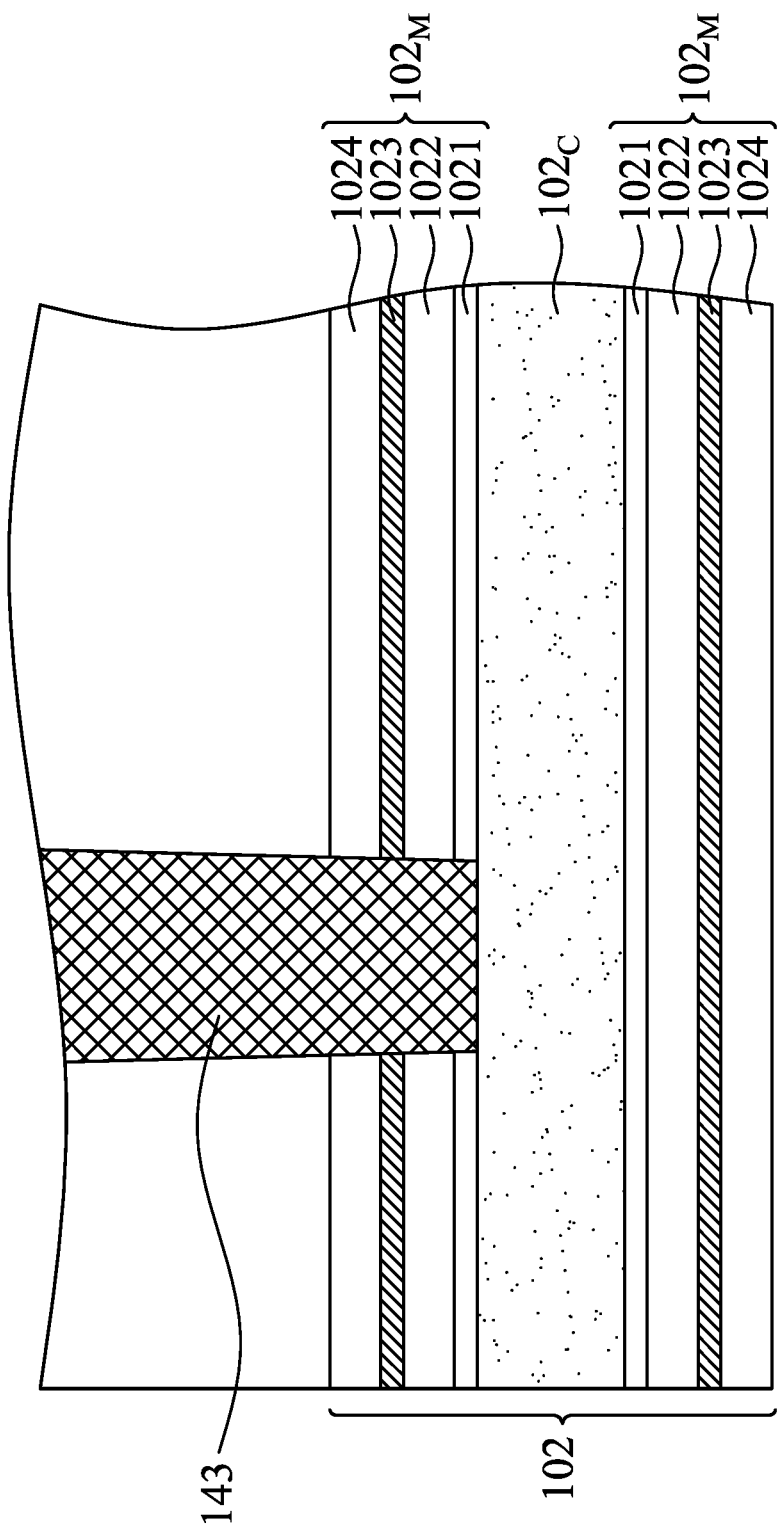
FIG. 3 is an enlarging drawing of a via structure in accordance with some embodiments of the present disclosure.

FIG. 3 is an enlarging drawing of a via structure in accordance with some embodiments of the present disclosure. In some embodiments, the composite layer 102$_M$ of the substrate 102 includes several insulating layers and a semiconductor layer such as a polysilicon layer. For example, the composite layer 102$_M$ may include at least two insulating layers and a polysilicon layer between the two insulating layers, and the via structure 143 is electrically connected to the polysilicon layer. According to some embodiments, when the via structure 143 including conductive material directly contacts the metal layer 150, the heat accumulated in the base 102$_C$ of the substrate 102 can be dissipated through the via structure 143. Also, the polysilicon layer of the composite layer 102$_M$ can be grounded by this via structure 143 including conductive material.

As shown in FIG. 3, the composite layer 102$_M$ includes the first oxide layer 1021, the polysilicon layer 1022, the second oxide layer 1023 and the nitride layer 1024. Although FIG. 3 depicts the composite layer 102$_M$ formed at upper and lower sides of the base 102$_C$, each of the material layers of the composite layer 102$_M$ encapsulate all of the surfaces (including the top surface, the bottom surface and all of the side surfaces) of the material layer previously formed. For example, the first oxide layer 1021 encapsulates the surfaces of the base 102$_C$ to seal the base 102$_C$. The polysilicon layer 1022 encapsulates the surfaces of the first oxide layer 1021 to seal the first oxide layer 1021 and the base 102$_C$. The second oxide layer 1023 encapsulates the surfaces of the polysilicon layer 1022 to seal the polysilicon layer 1022, the first oxide layer 1021 and the base 102$_C$. The nitride layer 1024 encapsulates the surfaces of the second oxide layer 1023 to seal the second oxide layer 1023, the polysilicon layer 1022, the first oxide layer 1021 and the base 102$_C$.

In some embodiments, as shown in FIG. 1K and FIG. 3, the top surface and the bottom surface of the via structure 143 directly contact the metal layer 150 and the base 102$_C$, respectively. If the via structure 143 includes a conductive material, the via structure 143 that is in contact with the polysilicon layer 1022 can release the charges generated by the plasma etching process which have accumulated in the polysilicon layer 1022. Thus, this via structure 143 functions as a ground. When the semiconductor structure of the embodiment is operated at a high voltage (such as a voltage over 600V), the problem of unwanted charges randomly moving under high voltage and affecting the electrical performance of the semiconductor structure can be solved, since the via structure 143 provides a path for releasing unwanted charges. In addition, in some embodiments, even if the base 102$_C$ includes a ceramic material with good thermal conductivity, the base 102$_C$ is sealed by the multi-layered composite layer 102$_M$, which makes it difficult for the base 102$_C$ to dissipate heat. Therefore, the via structure 143 that includes a material with good thermal conductivity and directly contacts the metal layer 150 and the base 102$_C$ can provide a path of heat dissipation for the base 102$_C$.

Additionally, the via structure 143 of the embodiments can be implemented in different types of applications. For example, in some embodiments, the via structure 143 can function as an isolation (including an insulating material) or function as a ground/a path of heat dissipation (including a conductive material) for an active region. In some other embodiments, the via structure 143 can function as an isolation (including an insulating material) or function as a ground/a path of heat dissipation (including a conductive material) for one or more semiconductor devices. Thus, the region and position for setting the via structure 143 can selected and adjusted according to the requirements of the semiconductor structure of the applications.

Figure 4:
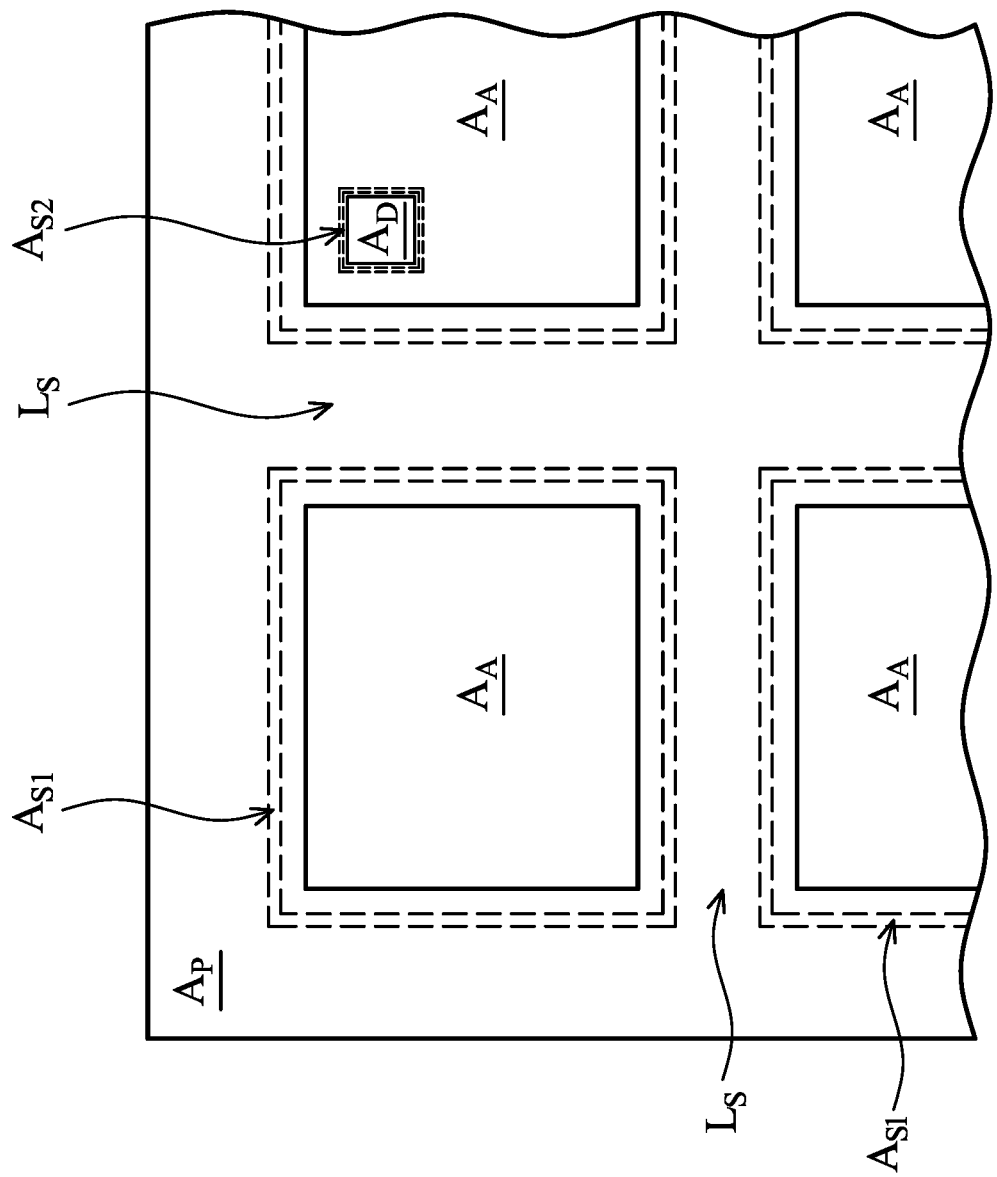
FIG. 4 illustrates active regions, a peripheral region and seal regions of a semiconductor structure in accordance with some embodiments of the present disclosure.

FIG. 4 illustrates active regions, a peripheral region and seal regions of a semiconductor structure in accordance with some embodiments of the present disclosure. As shown in FIG. 4, the peripheral region $A_P$ surrounds the active regions $A_A$, and the peripheral region $A_P$ includes cutting lines $L_S$. Although one region $A_D$ is depicted in one of the active regions $A_A$ in FIG. 4, each of the active regions $A_A$ includes several regions $A_D$.

In some embodiments, the via structure 143 can be disposed outside the active region $A_A$, such as disposed at the region $A_{S1}$, to provide an isolation for the active region $A_A$, or a ground and a path of heat dissipation. The regions $A_{S1}$ are disposed between the cutting lines $L_S$ and the active regions $A_A$. In this exemplification, the via structure 143 can effectively block the cracks as generated from entering the active regions $A_A$ during wafer dicing along the cutting lines $L_S$. Also, in this exemplification, the via structure 143 prevents moisture from penetrating into the active regions $A_A$ through a cutting plane, thereby improving the electrical performance and prolonging the operational life of the semiconductor devices. In addition, if the via structure 143 of some embodiments includes a conductive material and electrically connect the metal layers above, it can reduce unwanted signal interference to the semiconductor devices in the active region $A_A$.

In some other embodiments, the via structure 143 can be disposed inside the active region $A_A$ but outside the region $A_D$, such as disposed at the region $A_{S2}$. The region $A_{S2}$ may include one or more semiconductor devices. In this exemplification, the via structure 143 provides an isolation or provides a ground and a path of heat dissipation for the semiconductor devices.

Moreover, a top view of the via structure 143 disposed in the region $A_{S1}$ and/or the region $A_{S2}$ may present a continuous pattern such as a closed ring surrounding the active region $A_A$ and/or the region $A_D$. Alternatively, a top view of the via structure 143 may present a pattern including several separate segments disposed in the region $A_{S1}$ and/or the region $A_{S2}$. The actual top-view pattern of the via structure 143 can be modified and adjusted according to the requirements of the practical application. The disclosure has no limitation to the top-view pattern of the via structure 143.

A semiconductor structure in some embodiments includes a via structure 143 that penetrates at least the composite layer $102_M$ of the substrate 102 and is in contact with the base $102_C$ of the substrate 102. In some embodiments, the via structure 143 includes an insulating material for isolating an active region $A_A$ or isolating one or more of the semiconductor devices $S_D$ in an active region $A_A$. In some other embodiments, the via structure 143 includes a conductive material, such as a metal conductor or polysilicon, functioning as a ground for an active region $A_A$ or one or more semiconductor devices $S_D$ in the active region $A_A$ (such as releasing charges accumulated in the semiconductor layer of the composite layer $102_M$) and providing heat dissipation for the base $102_C$, thereby improving the electrical performance of the semiconductor structure. Furthermore, if the via structure 143 is disposed outside the active region $A_A$ and between the cutting lines $L_S$ and the active region $A_A$, it can effectively block the cracks from entering the active regions $A_A$ during wafer dicing. Also, in this exemplification, the via structure 143 is able to prevent moisture from penetrating into the active regions $A_A$ through a cutting plane, thereby improving the electrical performance and prolonging the operational life of the semiconductor devices. Also, according to the method of manufacturing the semiconductor structure in some embodiments, the via structure 143 continuously penetrates the epitaxial layer 111, the seed layer 104 and the composite layer $102_M$. According to the method of manufacturing the semiconductor structure in some other embodiments, the via structure 143 continuously penetrates the interlayer dielectric layer $IL_M$, the epitaxial layer 111, the seed layer 104 and the composite layer $102_M$. According to the manufacturing methods of the embodiments, the via structure 143 with a small size and a sufficient depth (that is, a via structure with a high aspect ratio of depth to width) can be formed. For example, the width W of the via structure 143 can be reduced to about 5 μm or less. Accordingly, the via structure 143 of the embodiment can be formed with very little or no impact on the original area of the semiconductor structure. Also, the electrical performances of the semiconductor structure can be significantly improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate, comprising a base and a composite layer encapsulating the base;
   a seed layer on the substrate;
   an epitaxial layer on the seed layer;
   a semiconductor device on the epitaxial layer;
   an interlayer dielectric layer on the epitaxial layer and covering the semiconductor device; and
   a via structure penetrating at least the interlayer dielectric layer, the epitaxial layer, the seed layer and the composite layer and in contact with the base of the substrate.

2. The semiconductor structure as claimed in claim 1, wherein the via structure comprises a conductive material.

3. The semiconductor structure as claimed in claim 2, wherein the composite layer comprises at least two insulating layers and a polysilicon layer between the two insulating layers, wherein the via structure is electrically connected to the polysilicon layer.

4. The semiconductor structure as claimed in claim 1, wherein the via structure comprises an insulating material.

5. The semiconductor structure as claimed in claim 1, further comprising a patterned metal layer on the interlayer dielectric layer, and the via structure is electrically connected to the patterned metal layer.

6. The semiconductor structure as claimed in claim 1, wherein an aspect ratio of the via structure is in a range of 1.6 to 8.

7. The semiconductor structure as claimed in claim 1, wherein the base comprises a ceramic material.

8. A method of manufacturing a semiconductor structure, comprising:
    providing a substrate, wherein the substrate comprises a base and a composite layer encapsulating the base;
    forming a seed layer on the substrate;
    forming an epitaxial layer on the seed layer;
    forming a semiconductor device on the epitaxial layer;
    forming an interlayer dielectric layer on the epitaxial layer, and the interlayer dielectric layer covering the semiconductor device; and
    forming a via structure that penetrates at least the interlayer dielectric layer, the epitaxial layer, the seed layer and the composite layer, wherein the via structure is in contact with the base of the substrate.

9. The method as claimed in claim 8, wherein the via structure as formed comprises a conductive material.

10. The method as claimed in claim 9, wherein the composite layer comprises at least two insulating layers and a polysilicon layer, and the polysilicon layer is disposed between the two insulating layers, wherein the via structure is electrically connected to the polysilicon layer.

11. The method as claimed in claim 8, wherein the via structure comprises an insulating material.

12. The method as claimed in claim 8, further comprising forming a patterned metal layer on the interlayer dielectric layer, wherein the via structure is connected to the patterned metal layer.

13. The method as claimed in claim 8, wherein forming the via structure that penetrates at least the composite layer comprises:
    forming a first mask layer on the interlayer dielectric layer;
    forming a second mask layer on the first mask layer;
    forming a patterned third mask layer on the second mask layer;
    etching the second mask layer, the first mask layer and interlayer dielectric layer using the patterned third mask layer, so as to form an opening exposing the epitaxial layer; and
    removing the patterned third mask layer.

14. The method as claimed in claim 13, wherein the first mask layer, the second mask layer and the patterned third mask layer comprise different materials.

15. The method as claimed in claim 13, wherein a first etchant gas is used to etch the second mask layer; and
    a second etchant gas is used to etch the first mask layer and the interlayer dielectric layer,
    wherein the first etchant gas and the second etchant gas have different fluorocarbon ratios.

16. The method as claimed in claim 13, wherein after the patterned third mask layer is removed, the method further comprises:
    etching the epitaxial layer and the seed layer along the opening of the second mask layer using the second mask layer as an etch mask, thereby exposing the substrate.

17. The method as claimed in claim 16, wherein etching the epitaxial layer and the seed layer comprise a plurality of etching steps, and a cleaning step is performed after each of the plurality of etching steps is completed.

18. The method as claimed in claim 16, wherein after the opening exposes the substrate, the method further comprises:
    removing the second mask layer by etching, wherein the opening is further extended to penetrate the composite layer and expose the base while the second mask layer is removed; and
    removing the first mask layer.

19. The method as claimed in claim 18, wherein the second mask layer is removed by dry etching, and the first mask layer is removed by wet etching.

* * * * *